United States Patent
Jin et al.

(10) Patent No.: US 11,803,960 B2
(45) Date of Patent: Oct. 31, 2023

(54) OPTICAL IMAGE CONTRAST METRIC FOR OPTICAL TARGET SEARCH

(71) Applicant: KLA Corporation, Milpitas, CA (US)

(72) Inventors: Huan Jin, Dublin, CA (US); Xiaochun Li, San Jose, CA (US); Sangbong Park, Dublin, CA (US); Zhifeng Huang, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 203 days.

(21) Appl. No.: 17/355,126

(22) Filed: Jun. 22, 2021

(65) Prior Publication Data
US 2022/0051380 A1 Feb. 17, 2022

Related U.S. Application Data

(60) Provisional application No. 63/064,531, filed on Aug. 12, 2020.

(51) Int. Cl.
*G06T 7/00* (2017.01)
*H01L 21/66* (2006.01)

(52) U.S. Cl.
CPC ............... *G06T 7/001* (2013.01); *H01L 22/12* (2013.01); *G06T 2207/30148* (2013.01); *G06T 2207/30168* (2013.01)

(58) Field of Classification Search
CPC ........... G06T 7/001; G06T 2207/30148; G06T 2207/30168; G06T 7/00; G06T 2207/20152; G06T 2207/30204; G06T 7/0006; H01L 22/12
See application file for complete search history.

(56) References Cited

U.S. PATENT DOCUMENTS

| | | | | |
|---|---|---|---|---|
| 7,755,768 | B2* | 7/2010 | Mansfield | G01B 11/0675 356/497 |
| 9,036,903 | B2* | 5/2015 | Hosoi | G06V 10/446 382/197 |
| 2001/0028732 | A1 | 10/2001 | Coulombe et al. | |
| 2004/0213451 | A1 | 10/2004 | Fang et al. | |
| 2006/0018514 | A1* | 1/2006 | Bankhead | G01B 11/303 382/108 |
| 2015/0146200 | A1* | 5/2015 | Honda | G01N 21/8806 356/237.5 |
| 2017/0191945 | A1 | 7/2017 | Zhang et al. | |

FOREIGN PATENT DOCUMENTS

EP 3174009 A1 5/2017

OTHER PUBLICATIONS

WIPO, ISR for International Application No. PCT/US2021/043366, Nov. 23, 2021.

* cited by examiner

*Primary Examiner* — Roy M Punnoose
(74) *Attorney, Agent, or Firm* — HODGSON RUSS LLP

(57) ABSTRACT

Global and local alignment energies are used in an image contrast metric. The image contrast metric can be used to find optical targets. Some pixels from a gradient magnitude image and a context range image from an optical image can be used to determine the image contrast metric. A heatmap from the image contrast metrics across part of a wafer can then be used to make a list of targets. Upper and lower confidence values can be applied to rank the available targets.

18 Claims, 3 Drawing Sheets

OPTICAL IMAGE CONTRAST METRIC FOR OPTICAL TARGET SEARCH

CROSS-REFERENCE TO RELATED APPLICATIONS

This application claims priority to the provisional patent application filed Aug. 12, 2020 and assigned U.S. App. No. 63/064,531, the disclosure of which is hereby incorporated by reference.

FIELD OF THE DISCLOSURE

This disclosure relates to defect detection for semiconductor wafers.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

Improved systems and methods for inspection are needed.

BRIEF SUMMARY OF THE DISCLOSURE

A system is provided in a first embodiment. The system includes a light source that generates a light beam; a stage configured to hold a wafer in a path of the light beam; a detector configured to receive the light beam reflected from the wafer; and a processor in electronic communication with the detector. The processor is configured to: generate an optical image using data from the detector; determine a gradient magnitude image from the optical image; determine a context range image from the optical image; select a first set of pixels from the gradient magnitude image and a second set of pixels from the context range image; and determine an image contrast metric using the first set of pixels and the second set of pixels, and a value $\alpha$ that is $\epsilon[0,1.0]$. The first set of pixels and the second set of pixels are less than 100%.

The image contrast metric can be determined by adding a product of $\alpha$ and an image contrast of the first set of pixels and a product of $(1-\alpha)$ and an image contrast of the second set of pixels.

The first set of pixels can be 10% of pixels in the gradient magnitude image. The second set of pixels can be 20% of pixels in the context range image.

The processor can be further configured to determine the image contrast metric at a plurality of locations across the semiconductor wafer. A sliding window can be used to generate the image contrast metric at the plurality of locations in a single frame. The processor can be further configured to: determine a heatmap from the image contrast metrics at the plurality of locations; apply an upper confidence level and a lower confidence level to the heatmap; select the image contrast metrics above the upper confidence level for a target list; and optionally select one or more of the image contrast metrics between the upper confidence level and the lower confidence level to fill any remaining slots on the target list.

A method is provided in a second embodiment. The method includes generating, using a processor, an optical image of a semiconductor wafer from data from an optical inspection system. The optical inspection system includes a light source and a detector. Using the processor, a gradient magnitude image is determined from the optical image. Using the processor, a context range image is determined from the optical image. Using the processor, a first set of pixels is selected from the gradient magnitude image and a second set of pixels is selected from the context range image. The first set of pixels and the second set of pixels are less than 100%. Using the processor, an image contrast metric is determined using the first set of pixels and the second set of pixels, and a value $\alpha$ that is $\epsilon[0,1.0]$.

The image contrast metric can be determined by adding a product of $\alpha$ and an image contrast of the first set of pixels and a product of $(1-\alpha)$ and an image contrast of the second set of pixels.

The first set of pixels can be 10% of pixels in the gradient magnitude image. The second set of pixels can be 20% of pixels in the context range image.

Determining the image contrast metric can occur at a plurality of locations across the semiconductor wafer. A sliding window can be used to generate the image contrast metric at the plurality of locations in a single frame. The method can further include: determining, using the processor, a heatmap from the image contrast metrics at the plurality of locations; applying, using the processor, an upper confidence level and a lower confidence level to the heatmap; selecting, using the processor, the image contrast metrics above the upper confidence level for a target list; and optionally selecting, using the processor, one or more of the image contrast metrics between the upper confidence level and the lower confidence level to fill any remaining slots on the target list.

A non-transitory computer-readable storage medium is provided in a third embodiment. The non-transitory computer-readable storage medium includes one or more programs for executing steps on one or more computing devices. The steps includes determining a gradient magnitude image from an optical image of a semiconductor wafer; determining a context range image from the optical image; selecting a first set of pixels from the gradient magnitude image and a second set of pixels from the context range image; and determining an image contrast metric using the first set of pixels and the second set of pixels, and a value $\alpha$ that is $\epsilon[0,1.0]$. The first set of pixels and the second set of pixels are less than 100%. For example, the first set of pixels and the second set of pixels are less than 100% of the pixels.

The image contrast metric can be determined by adding a product of $\alpha$ and an image contrast of the first set of pixels and a product of $(1-\alpha)$ and an image contrast the second set of pixels.

The first set of pixels can be 10% of pixels in the gradient magnitude image. The second set of pixels can be 20% of pixels in the context range image.

Determining the image contrast metric can occur at a plurality of locations across the semiconductor wafer. A sliding window can be used to generate the image contrast metric at the plurality of locations in a single frame. The steps can further include: determining a heatmap from the image contrast metrics at the plurality of locations; applying an upper confidence level and a lower confidence level to the heatmap; selecting the image contrast metrics above the upper confidence level for a target list; and optionally selecting one or more of the image contrast metrics between the upper confidence level and the lower confidence level to fill any remaining slots on the target list.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can characterize the quality of the alignment with the optical image and design from the perspective of the optical image quality. The alignment quality can affect defect of interest (DOI) sensitivity of multiple design-guided defect detection algorithms. Embodiment disclosed herein use an image contrast metric that can indicate if the optical image can be aligned to design. The metric can be used to qualify the optics mode with respect to the alignment performance and/or select the optimal image-based alignment sites to boost the overall confidence of the optical-to-design alignment performance. The image contrast metric can be used to determine if an alignment site is good or bad.

Figure 1:
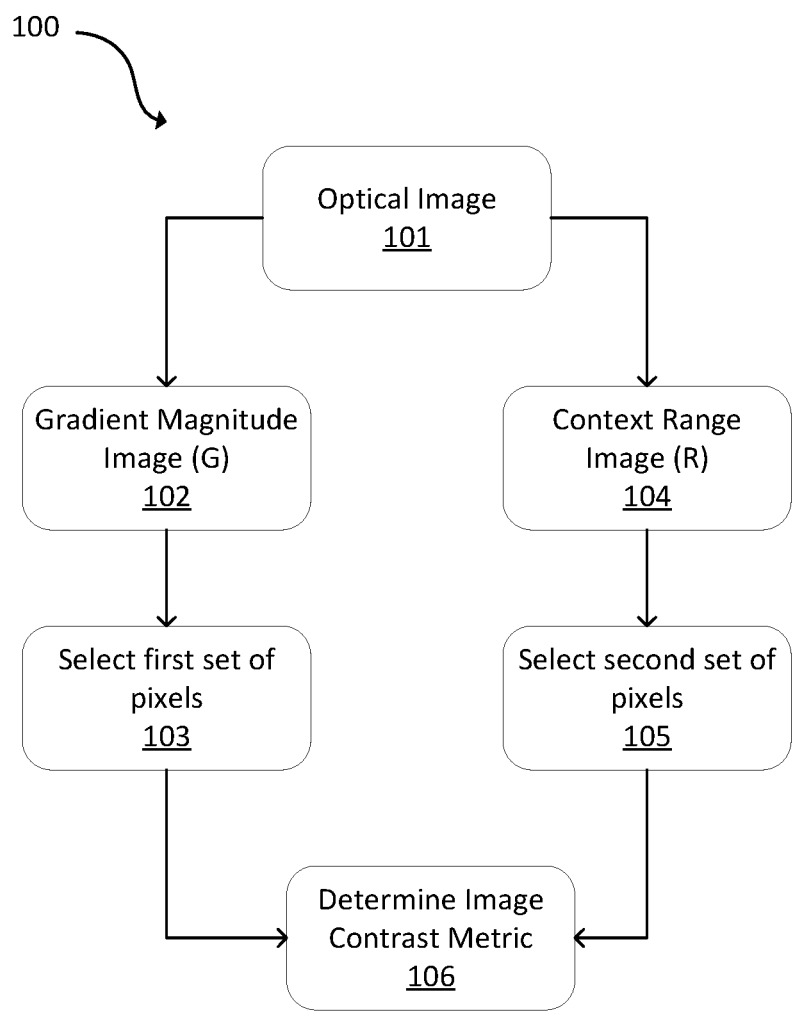
FIG. 1 is a flowchart of a first aspect of the embodiments.

FIG. 1 is a flowchart of a method 100. Some or all of the steps in the method 100 can use a processor. The resulting image contrast metric takes the optical image's global and local alignment energies into consideration. The global alignment energy is represented by image's context dynamic range. The local alignment energy is represented by image's gradient magnitude normalized by the context dynamic range. The image contrast metric combines both energies with the weight coefficient for the flexible adjustment. Because the metric is uniformly bounded to the range of [0, 1.0], it can be used to characterize the ability to align optical images across wafer and optics modes. Using the [0, 1.0] scale can keep the results normalized.

An optical image is generated at 101. The optical image can be generated from data from an optical inspection system, such as an optical inspection system with a light source and a detector.

A gradient magnitude image is determined from the optical image at 102. An image gradient is a directional change in the intensity. The gradient of the image contains components: x-derivative (Gx) and y-derivative (Gy). The gradient magnitude M is determined as the square root of $(Gx^2+Gy^2)$.

A context range image is determined from the optical image at 104. Given a predefined context window, for each pixel in the image, the range value can be determined by the absolute difference of local minimum and maximum intensities that are found within the context window.

A first set of pixels is selected from the gradient magnitude image at 103. After the gradient magnitude image is determined, all the magnitude pixel values can be sorted in a descending order. The top (or first) N percentage of magnitude pixels can be chosen to calculate the corresponding metric. The first set of pixels is less than 100% of the pixels in the gradient magnitude image. In an instance, the first set of pixels is 10% of pixels in the gradient magnitude image, but other values can be used. In the alignment applications, high-frequency signal contributes more than low-frequency one. Using 10% of pixels provided the improved results based on the testing on various wafers.

A second set of pixels is selected from the context range image at 105. The second set of pixels is selected similar to the magnitude pixel selection. The second set of pixels is less than 100% of the pixels in the context range image. In an instance, the second set of pixels is 20% of pixels in the context range image, but other values can be used. The context range image can provide the normalization term for the optical image. The normalization may need to be stable and unaffected by noise. Therefore, taking the average of N percentage of a top range pixel values can remove noisy high-frequency signal and stabilize the normalization term calculation.

An image contrast metric is determined at 106 using the first set of pixels, the second set of pixels, and a value α that is $\epsilon[0,1.0]$. For example, the image contrast metric can be determined using the formula $IC=\alpha(IC_{gradient})+(1-\alpha)(IC_{range})$. In the formula, IC is the image contrast metric, $IC_{gradient}$ is the image contrast of the first set of pixels, and $IC_{range}$ is the image contrast of the second set of pixels. The image contrast metric is insensitive to the image's dynamic ranges and combines both energies of context dynamic range and gradient magnitude.

Image contrast can be determined using a formula $IC=\alpha(\Sigma_{k\in K}\|\Delta I'_k\|)+(1-\alpha)(\Sigma_{g\in G}R_g)$. K is the set of pixel indices in a top 10% largest $\|\Delta I'_k\|$, G is a set of pixel indices in the top 20% of the largest R, and α is $\epsilon[0,1.0]$. $\Sigma_{k\in K}\|\Delta I'_k\|$ represents the gradient component. $\Sigma_{g\in G}R_g$ represents the dynamic range component. $I'_k$ is the image gradient vector, which can be in two dimensions. R is the context range image.

Image contrast can be calculated on image I' normalized by the context range found by max(R). Context Dynamic Range can be calculated with 5×5 windows, 7×7 windows, 9×9 windows, or other sized windows.

Alignment performance can be impacted by the image sharpness (x/y energy change). Both gradient magnitude (finest, local) and context range (coarse, global) can represent the image sharpness quality for alignment. Image normalization may be needed to compare images across wafers or optics. However, normalization by a large range can reduce the energy of gradient magnitude. Range energy can be used to compensate gradient magnitude energy.

The image contrast metric can be determined a multiple locations across a semiconductor wafer. Each pixel in the optical image can have a corresponding image contract (IC) value. Theoretically, all pixel traversal is needed to calculate IC. To expedite the IC calculation, a fixed target window size and moving step are predefined to sample the optical pixels. For example, if the window step is 1 pixel for both x and y direction, then it is equivalent to sample all the pixels in the optical image.

The resulting image contrast metric can be used to quantify the image's blurriness. The image contrast metric can provide an accurate correlation between image quality and alignment performance. Its usage can improve the salient alignment site selection and increase DOI sensitivity.

A global image contrast threshold can be used to qualify the optical images from the alignment perspective cross-wafer and cross-optics. It can enable various alignment-based characterizations. For example, the alignment sites with best image contrast metrics improve optical-to-design alignment, which can improve pixel-to-design alignment (PDA). PDA accuracy can be important for certain types of inspection, such as those in which design information is used during inspection to perform one or more functions. PDA is a design-based alignment methodology that can improve the defect location accuracy reported by an inspection tool, such as a scanning electron microscope (SEM). PDA target selection may be based on image salient features.

Figure 2:
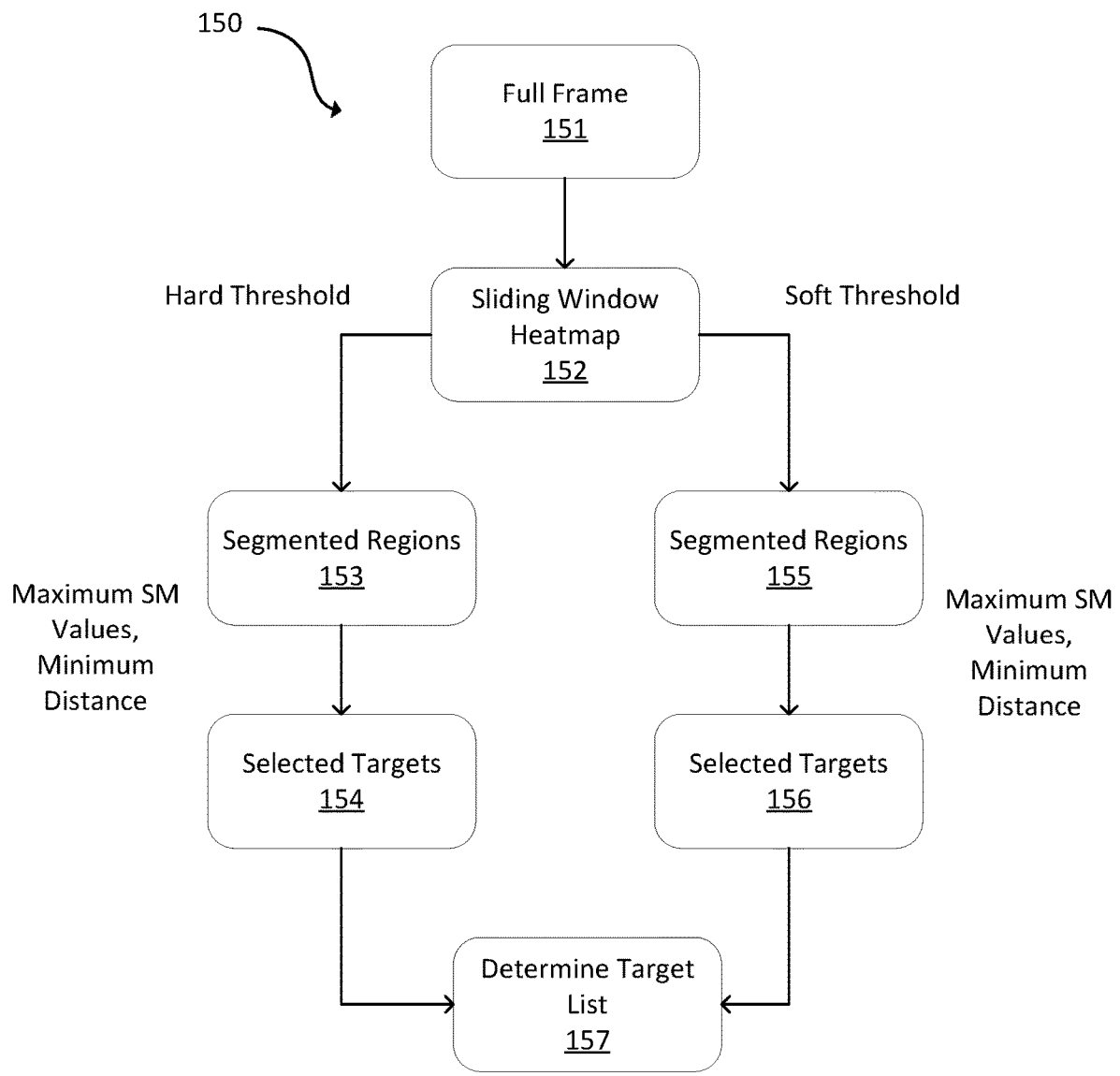
FIG. 2 is a flowchart of a second aspect of the embodiments.

The image contrast metric can be used to quantify the optical-to-design alignment performance. Thus, the image contrast metric is an example of a metric used in method 150, which is shown in FIG. 2. Some or all of the steps in the method 150 can use a processor.

Embodiments of the method 150 can automatically seek the best targets to improve the quality of the alignment with the optical image and design for defect detection. For example, a semiconductor manufacturer may need to know where the best targets (e.g., five targets) are on a 1000×1000 pixel image. A linked list of best target candidates can be used for optical-to-design alignment, and an automated best target search algorithm can assist with finding best target candidates. A salient target search algorithm can combine image saliency and marker-based watershed segmentation method. The optical target search algorithm integrates multi-confidence-level strategy into the mark-based watershed algorithm and can achieve the optimal optical target selection uniformly across the wafer die to improve the PDA performance. Using the marker-based watershed segmentation method with a multi-confidence-level strategy can automatically select optimal optical targets in a uniform distribution with geometrical diversity to prevent the selected targets from falling in the close neighborhood. Testing has shown that the method 150 outperforms current region-based target searches with better optical-design alignment rates.

A full frame of an image is provided at 151. A frame can typically be 1536×768 pixels or 1024×1024 pixels, though other frame sizes can be used. A sliding window technique is used to generate an image contrast metric at multiple locations in a single frame. The sliding window operation is a sampling method. The IC value is calculated given a bounding box (i.e., window or sub-image), which is typically smaller than the frame size. To cover the entire frame, the window size and moving step (e.g., how many pixels to advance in 2D direction) are determined, and the same-sized window is moved to get the distribution of IC values on the entire frame. The part (or target window) size can be defined by a user. Typical part size is 192×192 pixels. The window size ratio to frame may be in the range of [0.05, 0.2], In general, an optical image is a frame with millions of pixels. A sliding window with thousands of pixels, such as 192×192 pixels or other sizes, can be applied to create the saliency metric heatmap with an adjustable step (e.g., ⅛ or ¼ window size). The saliency metric heatmap can be the IC value image computed by the sliding window. It can be seen as the down-sampled feature image (e.g., the feature is IC). It contains the IC values and their location information, which are used to find the best (i.e., most salient) location for image alignment applications.

There are many options for saliency metric (SM), such as image gradients, intensity operations, image contrast metrics, etc. For example, the image contrast metric from method 100 is an example of a saliency metric. The image contrast metric can be performed only with pixels within the sliding window image. The saliency metric may consider both gradient magnitude (finest, local) and context range (coarse, global), so it can represent the image sharpness quality for alignment.

A heatmap is determined from the image contrast metrics at the locations at 152. The heatmap can be generated by determining an IC metric for individual sliding windows. The heatmap can be a saliency metric heatmap. The saliency metric heatmap can be generated from a single frame. The heatmap can be a data visualization technique that illustrates magnitude (e.g., with values or color).

An upper confidence level ("hard threshold") is applied to the heatmap at 153 and 154. A lower confidence level ("soft threshold") is also applied to the heatmap at 155 and 156. Thresholding can be performed on the heatmap to extract locations with a high saliency metric (e.g., IC). Image contrast metrics above the upper confidence level are selected for the target list at 157. Optionally, one or more image contrast metrics between the upper confidence level and the lower confidence level are used to fill any remaining slots on the target list after the image contrast metrics above the upper confidence level are selected. Image contrast metrics below the lower confidence level can be excluded.

A hard threshold can be determined by examining massive optical images corresponding to their alignment performance. If one target has the IC value lower than the hard threshold, it will be discarded regardless.

The soft threshold can select the optical set of targets from the survival candidates after the hard thresholding operation. The soft threshold can be dynamic and used to control the number of the final selected targets.

The confidence levels can be set or otherwise configured according to the dynamic range of the saliency metric heatmap. In an example with a hard threshold and a soft threshold, any saliency metric values above the hard threshold means the corresponding targets have the priorities to be selected. The hard threshold may be empirical based on the saliency metric that is used, but the soft threshold may be adapted to the search. Any saliency metric values below the soft threshold means the corresponding targets are ignored. The targets with the saliency metric values between the hard and soft thresholds can be on a "waiting list" if the length of the linked list of best target candidates is less than the requested amount. Thus, if there are not enough targets with a saliency metric value above the upper confidence level, then targets from the wait list can be used. Any extracted targets can be ranked by their saliency metric value (e.g., in descending order). The best targets with optical saliency metrics can improve design alignment refinement, which can improve PDA.

The marker-based watershed algorithm runs on the saliency metric heatmap with the upper and lower confidence level. The markers can be generated by distance transform and adaptable thresholding. The best targets can be extracted from each watershed segmented regions according to their local maximum values. If more than one target can be extracted from a relatively large segmented regions, then a strategy of the minimum distance between two neighboring targets can be implemented. Using a minimum distance between two neighboring targets can help maintain a desired distribution of targets in the frame. Using two targets that are in close proximity can affect performance, so only one of these proximate targets may be selected.

In an example of the method 150, optical images for the alignment sites and designs are collected. The alignment accuracy of an individual pair of optical and design are verified for ground truth. A saliency metric heatmap is determined from the optical images. The marker-based segmentation and multi-confidence-level strategy is applied to generate the linked list of the best target candidates from the saliency metric heatmap. The best targets from the linked list are used in the PDA workflow to obtain optical-to-design alignment offsets. These alignment offsets were compared to the ground truth. The comparisons can be repeated for the alignment sites from the multiple wafers and different optics modes.

Figure 3:
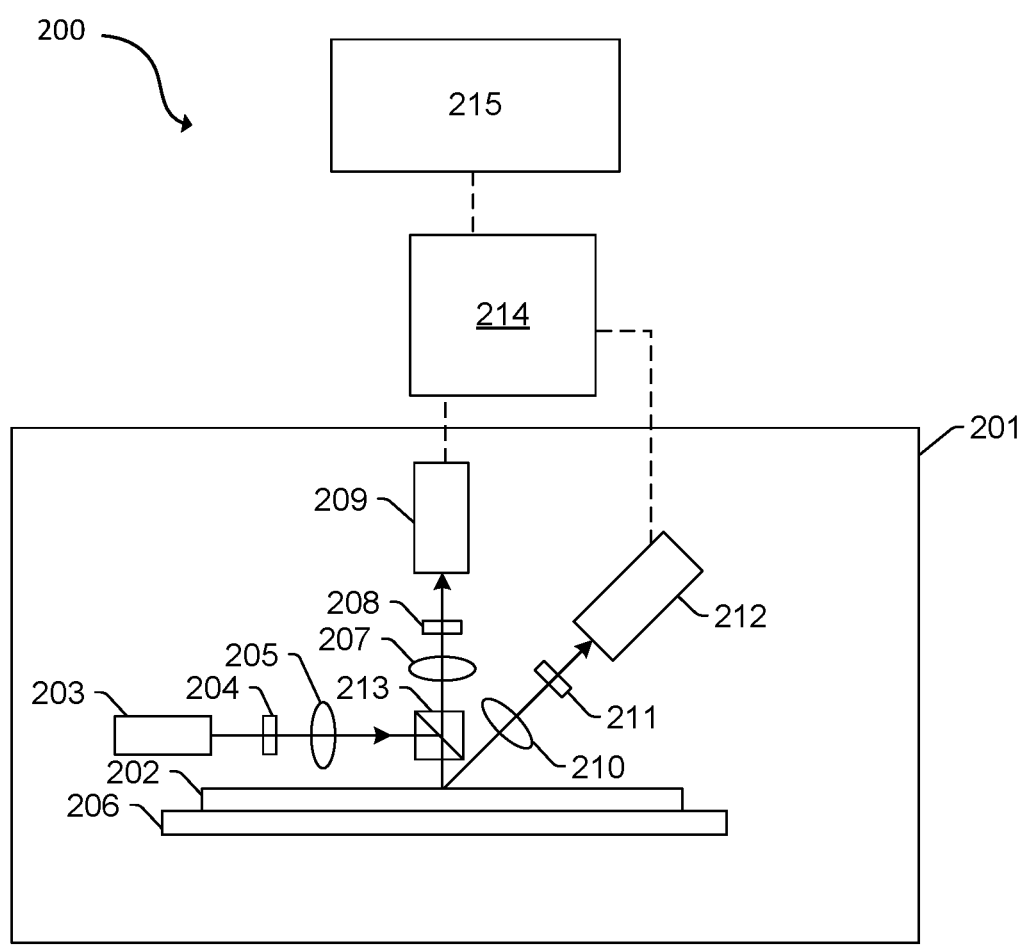
FIG. 3 is a diagram of a system in accordance with the present disclosure.

One embodiment of a system 200 is shown in FIG. 3. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 3, optical based subsystem 201 includes an illumination subsystem configured to direct light to specimen 202. The illumination subsystem includes at least one light source. For example, as shown in FIG. 3, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 3, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 3. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 3 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 3) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 3 as a single refractive optical element, it is to be understood that, in practice, lens 205 may include a number of refractive and/or reflective optical elements that in combination focus the light from the optical element to the specimen. The illumination subsystem shown in FIG. 3 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 3 includes two detection channels, one formed by collector 207, element 208, and detector 209 and another formed by collector 210, element 211, and detector 212. As shown in FIG. 3, the two detection channels are configured to collect and detect light at different angles of collection. In some instances, both detection channels are configured to detect scattered light, and the detection channels are configured to detect light that is scattered at different angles from the specimen 202. However, one or more of the detection channels may be configured to detect another type of light from the specimen 202 (e.g., reflected light).

As further shown in FIG. 3, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 3 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 3 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 3 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 3 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein, such as method 100 and/or 150. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to generate an optical image using data from the detector (e.g., detector 209 or detector 212). A gradient magnitude image and a context range image are determined from the optical image. A first set of pixels are selected from the gradient magnitude image and a second set of pixels are selected from the context range image. The first set of pixels and the second set of pixels are less than 100%. An image contrast metric is then determined using the first set of pixels and the second set of pixels, and a value $\alpha$ that is $\in[0,1.0]$. For example, the image contrast metric can be determined by adding a product of $\alpha$ and the first set of pixels and a product of $(1-\alpha)$ and the second set of pixels. The image contrast metric can be determined at a plurality of locations across the semiconductor wafer.

The processor 214 can use a sliding window that is used to generate the image contrast metric at the plurality of locations in a single frame. The processor 214 also can be configured to determine a heatmap from the image contrast metrics at the plurality of locations; apply an upper confidence level and a lower confidence level to the heatmap;

select the image contrast metrics above the upper confidence level for a target list; and optionally select one or more of the image contrast metrics between the upper confidence level and the lower confidence level to fill any remaining slots on the target list.

An additional embodiment relates to a non-transitory computer-readable medium storing program instructions executable on a controller for performing a computer-implemented method for search for optical targets, as disclosed herein. In particular, as shown in FIG. 3, electronic data storage unit 215 or other storage medium may contain non-transitory computer-readable medium that includes program instructions executable on the processor 214. The computer-implemented method may include any step(s) of any method(s) described herein, including method 100 and/or method 150.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
a light source that generates a light beam;
a stage configured to hold a wafer in a path of the light beam;
a detector configured to receive the light beam reflected from the wafer; and
a processor in electronic communication with the detector, wherein the processor is configured to:
generate an optical image using data from the detector;
determine a gradient magnitude image from the optical image;
determine a context range image from the optical image;
select a first set of pixels from the gradient magnitude image and a second set of pixels from the context range image, wherein the first set of pixels and the second set of pixels are less than 100%; and
determine an image contrast metric using the first set of pixels and the second set of pixels, and a value α that is ϵ[0,1.0].

2. The system of claim 1, wherein the image contrast metric is determined by adding a product of α and an image contrast of the first set of pixels and a product of (1−α) and an image contrast of the second set of pixels.

3. The system of claim 1, wherein the first set of pixels is 10% of pixels in the gradient magnitude image, and wherein the second set of pixels is 20% of pixels in the context range image.

4. The system of claim 1, wherein the processor is further configured to determine the image contrast metric at a plurality of locations across the semiconductor wafer.

5. The system of claim 4, wherein a sliding window is used to generate the image contrast metric at the plurality of locations in a single frame.

6. The system of claim 4, wherein the processor is further configured to:
determine a heatmap from the image contrast metrics at the plurality of locations;
apply an upper confidence level and a lower confidence level to the heatmap;
select the image contrast metrics above the upper confidence level for a target list; and
optionally select one or more of the image contrast metrics between the upper confidence level and the lower confidence level to fill any remaining slots on the target list.

7. A method comprising:
generating, using a processor, an optical image of a semiconductor wafer from data from an optical inspection system, wherein the optical inspection system includes a light source and a detector;
determining, using the processor, a gradient magnitude image from the optical image;
determining, using the processor, a context range image from the optical image;
selecting, using the processor, a first set of pixels from the gradient magnitude image and a second set of pixels from the context range image, wherein the first set of pixels and the second set of pixels are less than 100%; and
determining, using the processor, an image contrast metric using the first set of pixels and the second set of pixels, and a value α that is ϵ[0,1.0].

8. The method of claim 7, wherein the image contrast metric is determined by adding a product of α and an image contrast of the first set of pixels and a product of (1−α) and an image contrast of the second set of pixels.

9. The method of claim 7, wherein the first set of pixels is 10% of pixels in the gradient magnitude image, and wherein the second set of pixels is 20% of pixels in the context range image.

10. The method of claim 7, wherein determining the image contrast metric occurs at a plurality of locations across the semiconductor wafer.

11. The method of claim 10, wherein a sliding window is used to generate the image contrast metric at the plurality of locations in a single frame.

12. The method of claim 10, wherein the method further includes:
determining, using the processor, a heatmap from the image contrast metrics at the plurality of locations;
applying, using the processor, an upper confidence level and a lower confidence level to the heatmap;
selecting, using the processor, the image contrast metrics above the upper confidence level for a target list; and
optionally selecting, using the processor, one or more of the image contrast metrics between the upper confidence level and the lower confidence level to fill any remaining slots on the target list.

13. A non-transitory computer-readable storage medium, comprising one or more programs for executing the following steps on one or more computing devices:
determining a gradient magnitude image from an optical image of a semiconductor wafer;
determining a context range image from the optical image;
selecting a first set of pixels from the gradient magnitude image and a second set of pixels from the context range image, wherein the first set of pixels and the second set of pixels are less than 100%; and determining an image contrast metric using the first set of pixels and the second set of pixels, and a value α that is ∈[0,1.0].

14. The non-transitory computer-readable storage medium of claim 13, wherein the image contrast metric is determined by adding a product of α and an image contrast of the first set of pixels and a product of (1−α) and an image contrast of the second set of pixels.

15. The non-transitory computer-readable storage medium of claim 13, wherein the first set of pixels is 10% of pixels in the gradient magnitude image, and wherein the second set of pixels is 20% of pixels in the context range image.

16. The non-transitory computer-readable storage medium of claim 13, wherein determining the image contrast metric occurs at a plurality of locations across the semiconductor wafer.

17. The non-transitory computer-readable storage medium of claim 16, wherein a sliding window is used to generate the image contrast metric at the plurality of locations in a single frame.

18. The non-transitory computer-readable storage medium of claim 16, wherein the steps further include:
determining a heatmap from the image contrast metrics at the plurality of locations;
applying an upper confidence level and a lower confidence level to the heatmap;
selecting the image contrast metrics above the upper confidence level for a target list; and
optionally selecting one or more of the image contrast metrics between the upper confidence level and the lower confidence level to fill any remaining slots on the target list.

* * * * *